(12) United States Patent
Manepalli et al.

(10) Patent No.: US 7,339,276 B2
(45) Date of Patent: Mar. 4, 2008

(54) UNDERFILLING PROCESS IN A MOLDED MATRIX ARRAY PACKAGE USING FLOW FRONT MODIFYING SOLDER RESIST

(75) Inventors: Rahul N. Manepalli, Phoenix, AZ (US); Saravanan Krishnan, Penang (MY); Choong Kooi Chee, Penang (MY)

(73) Assignee: Intel Corporation, Santa Clara, CA (US)

( * ) Notice: Subject to any disclaimer, the term of this patent is extended or adjusted under 35 U.S.C. 154(b) by 271 days.

(21) Appl. No.: 10/287,318

(22) Filed: Nov. 4, 2002

(65) Prior Publication Data

US 2004/0084209 A1 May 6, 2004

(51) Int. Cl.
*H01L 23/38* (2006.01)
*H01L 23/58* (2006.01)
*H05K 7/00* (2006.01)

(52) U.S. Cl. .................. 257/778; 257/575; 257/934; 257/789; 361/783

(58) Field of Classification Search ............... 257/778, 257/678, 934, 789, 783, 575; 361/783
See application file for complete search history.

(56) References Cited

U.S. PATENT DOCUMENTS

| | | | | |
|---|---|---|---|---|
| 5,854,507 A * | 12/1998 | Miremadi et al. | ........... | 257/686 |
| 5,883,426 A * | 3/1999 | Tokuno et al. | ............... | 257/686 |
| 6,025,648 A * | 2/2000 | Takahashi et al. | ........... | 257/778 |
| 6,121,682 A * | 9/2000 | Kim | ........................... | 257/723 |
| 6,324,069 B1 * | 11/2001 | Weber | ........................ | 361/783 |
| 6,563,712 B2 * | 5/2003 | Akram et al. | ................ | 361/719 |
| 6,580,169 B2 * | 6/2003 | Sakuyama et al. | ........... | 257/738 |

* cited by examiner

*Primary Examiner*—Howard Weiss
*Assistant Examiner*—Steven H Rao
(74) *Attorney, Agent, or Firm*—Laleh Jalali

(57) ABSTRACT

Placing a flow modifier on a package substrate to create two flow fronts on a molded matrix array package. A flow modifier may be laid on a package substrate to a height that blocks off the bottom of other substrates (e.g., dice) coupled to the package substrate. By separating the top flow front and the bottom flow front, this process prevents the top flow front from wrapping around the sides of the substrates and trapping air below each substrate and in front of the bottom flow front.

31 Claims, 14 Drawing Sheets

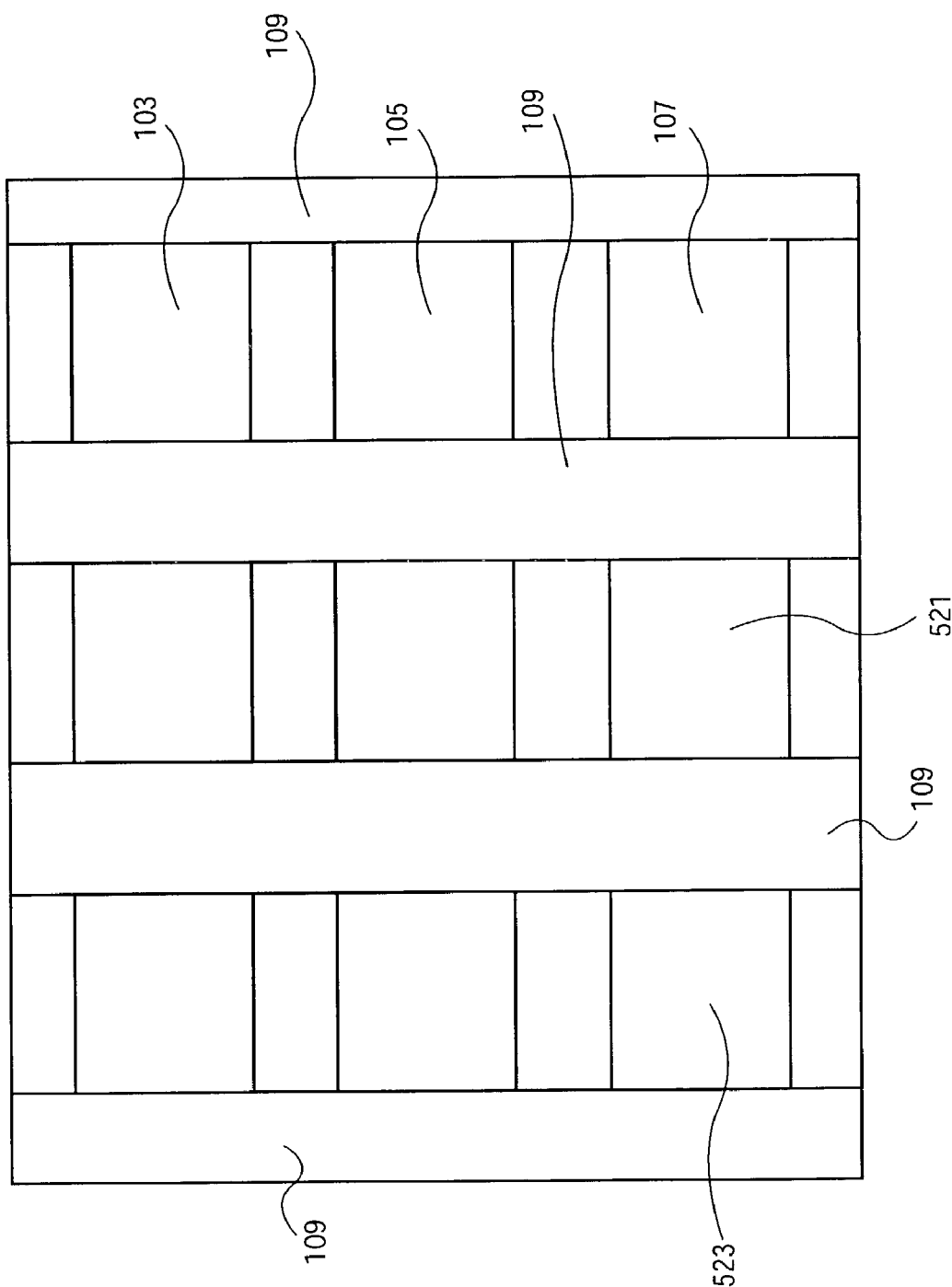

UNDERFILLING PROCESS IN A MOLDED MATRIX ARRAY PACKAGE USING FLOW FRONT MODIFYING SOLDER RESIST

BACKGROUND

1. Technical Field

An embodiment of the invention relates generally to manufacturing electronic circuit assemblies, and in particular to the molding process of a molded matrix array package.

2. Description of the Related Art

Molded matrix array packages are underfilled and overmolded in a single step. This may include several flip chips mounted on a substrate. After underfilling and overmolding all of the flip chips on the substrate, the individual flip chips may be singulated into packages. Variations in the mold flow both on top and on bottom of the flip chips can cause multiple problems in the molding process. In addition, because the molding compound can flow around and over each die prior to a molding compound underfilling the die, air may be trapped under the die. The trapped air under the die may cause a void that will decrease reliability in the package. To reduce the size of the void in a conventional process, a low pressure region may be created in the mold chase to eliminate trapped air. In addition, a small hole may be poked through the substrate under each die to allow air in the void to escape as the molding process finishes. However, using a low pressure region or poking a hole in the substrate may increase the cost of producing the package and may reduce the reliability of the package.

BRIEF DESCRIPTION OF THE DRAWINGS

The invention may best be understood by referring to the following description and accompanying drawings that are used to illustrate the embodiments of the invention. In the drawings:

FIG. 5A shows a top view of an embodiment of the invention after the dice have been coupled to the package substrate.

DETAILED DESCRIPTION OF THE INVENTION

In the following description numerous specific details are set forth. However, it is understood that the embodiments of the invention may be practiced without these specific details. In other instances, well-known details such as particular materials or methods have not been shown in detail in order not to obscure the understanding of this description.

Figure 1:
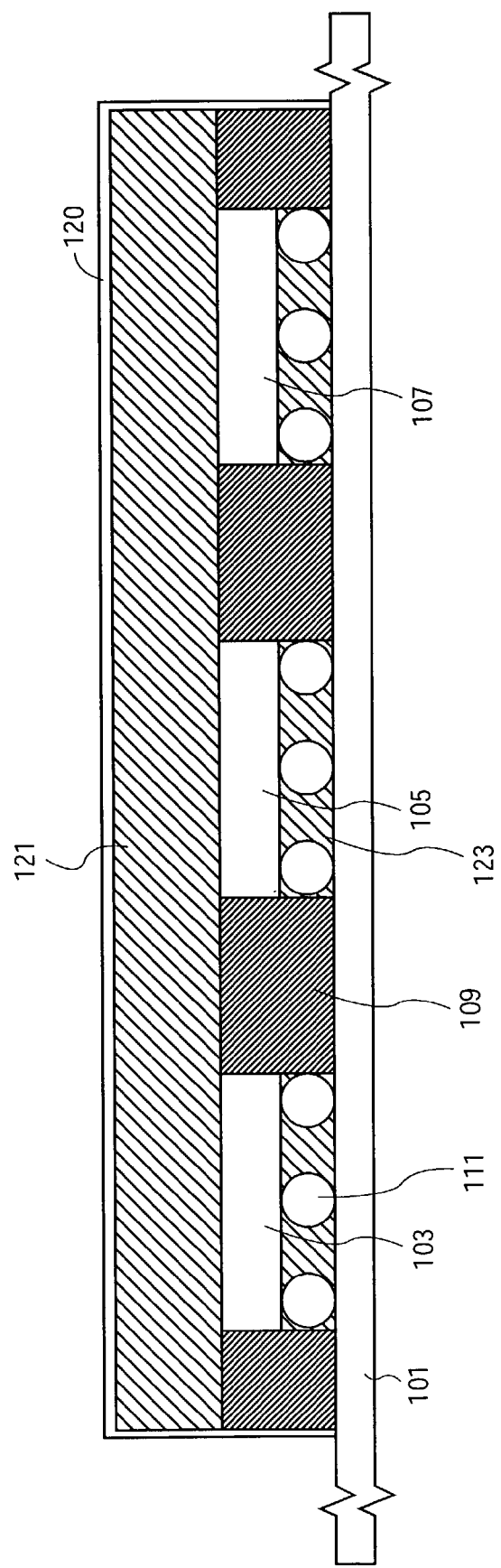
FIG. 1 shows a side view of an embodiment of the invention showing a cross section of flow front modifiers.

Referring to FIG. 1, a side view of an embodiment of the invention is shown having two separate mold flows. In one embodiment of the invention, the top mold flow 121 flowing between the top of the dice 103, 105, and 107 and the mold chase 120, and the bottom mold flow 123 between the dice 103, 105, and 107 and the package substrate 101, are kept separate by flow modifier 109. By splitting the mold flow into two separate mold flows using the flow modifier 109, the top mold flow 121 may be prevented from wrapping over the dice 103, 105, and 107. Without the flow modifier 109, the bottom mold flow 123 and the resulting overwrapping mold flow (not shown) from the top of the dice 103, 105, and 107, may trap air pockets (not shown) under the dice 103, 105, and 107.

In one embodiment package substrate 101 is a printed circuit board (PCB) and dice 103, 105, and 107 are flip chips. Other embodiments may use other types of package substrates and dice. Electrical connections, such as but not limited to C4 solder bump 111, may be used to couple the dice 103, 105, and 107 to the package substrate 101 before or after the flow modifier 109 is applied. Electrical connections may be applied to connect electrical circuits in the package substrate 101 to electrical circuits in dice 103, 105, and 107. The flow modifier 109 may be a solder resist mask. In some embodiments the solder resist mask material comprises thermoset resins for eg epoxy, polyimide and polyacrylate. Other embodiments may use other types of material in flow modifier 109. In one embodiment, the composition of the solder bump 111 may be comprised of lead and tin. In other embodiments, other solder bump compositions may be used.

Figure 2:
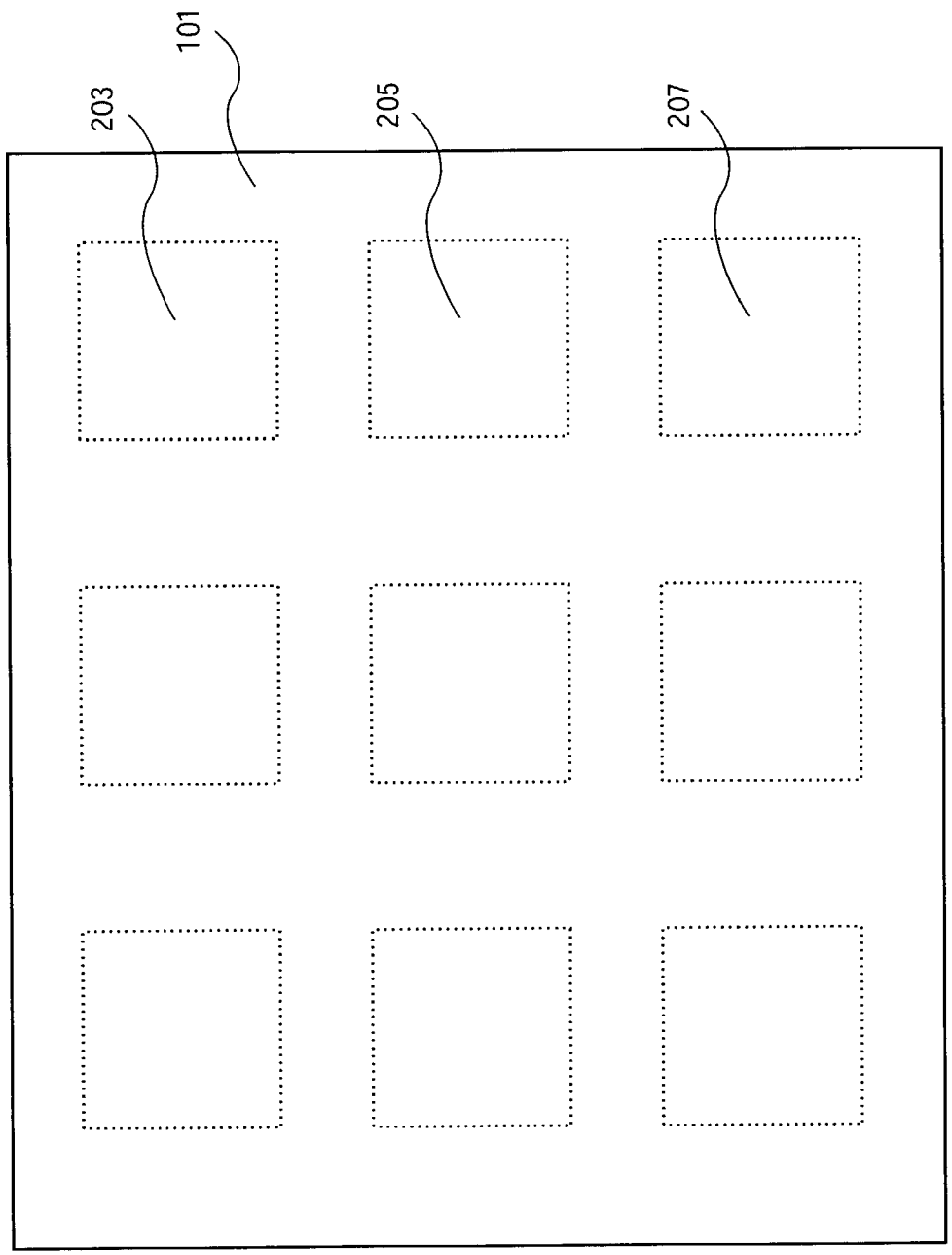
FIG. 2 shows a top view of an embodiment of the invention indicating device placement locations.

Referring to FIG. 2, a top view of an embodiment of the invention is shown with device placement locations. Referring also to FIG. 1, because the flow modifier 109 may be applied before the dice 103, 105, and 107 are coupled to package substrate 101, the device placement locations 203, 205, and 207 for the dice 103, 105, and 107, respectively, may be prearranged in a pattern on a package substrate 101. The surface of the package substrate 101 between each device placement location 203, 205, and 207 may be covered with flow modifier 109 to a height sufficient to separate the mold flow into two'flows: a top mold flow 121 and a bottom mold flow 123. Note: Although specific devices and locations are identified in the figures and referred to in the text, the identified locations and devices may be considered generic examples of similar locations and devices that are also shown in the figures but may be unlabeled.

For the height of the flow modifier 109 to be sufficient to separate the mold flow into two flows, the flow modifier 109 may need to be at least equal to the distance between the surface of the package substrate and the surface of the die that is nearest the package substrate. In one embodiment the flow modifier height is approximately equal to the diameter of a solder bump 111. In another embodiment the flow modifier height is equal to a diameter of a solder bump 111 plus a thickness (referring to the smallest thickness) of a die 103. Other heights may also be used. In addition, the surface of the package substrate 101 between the outer sides of the device placement locations 203, 205, and 207 and the outer edge of the package substrate 101 may also have flow modifier 109 applied to keep the top mold flow 121 and the bottom mold flow 123 separate.

Figure 3:
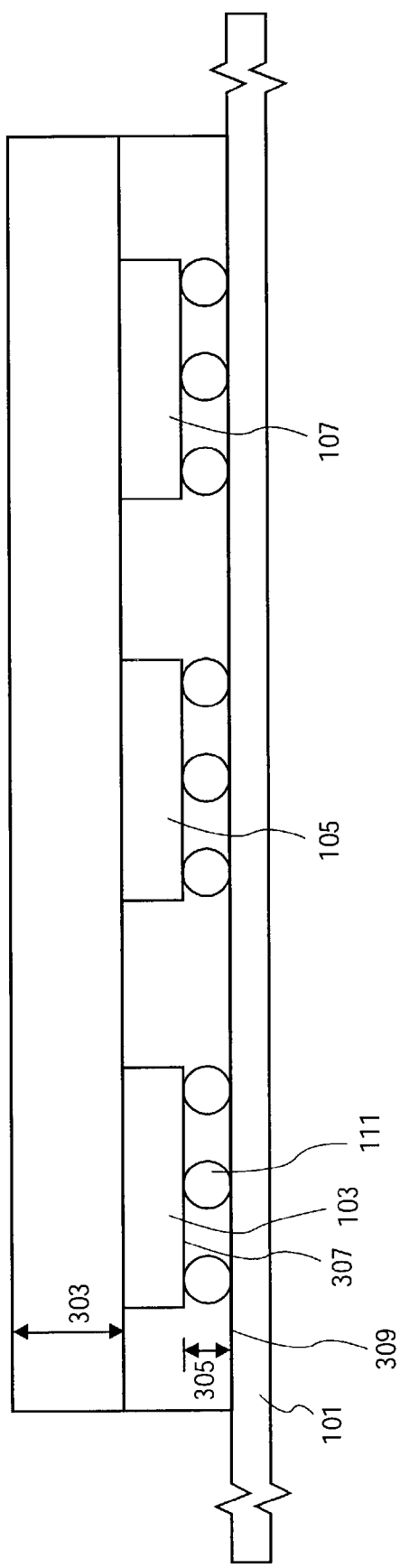
FIG. 3 shows a side view of an embodiment of the invention showing a cross section at a right angle to the view of FIG. 1, indicating flow modifier height indicators.

Referring to FIG. 3, a side view of an embodiment of the invention is shown with gap height indicators used for determining the height of the flow modifiers. The top gap height 303 is dependent on the distance between the top of the dice 103, 105, and 107 and the mold chase 120 (seen in FIG. 1). The height of the flow modifier on the package substrate 101 may depend partially on the standoff height 305. The height of the flow modifier may need to be at least as high as the standoff height 305 to prevent the top mold flow 121 (seen in FIG. 1) from getting under dice 103, 105, and 107. In one embodiment, the flow modifier may extend from an upper surface 309 of the package substrate 101 to a height at least even with a lower surface 307 of a die, such as die 103. In one embodiment of the invention, the standoff height 305 between the dice 103, 105, and 107 and the package substrate 101 may be dependent on the height of solder bumps 111. Because the flow modifier 109 may be applied before or after the dice 103, 105, and 107 are laid down, the height and placement of the flow modifier 109 may be predetermined. The placement of the flow modifier 109 may be predetermined by arranging the device placement locations 203, 205, and 207 (seen in FIG. 2) in order to determine where the flow modifier 109 may be applied.

Referring to FIG. 1 and FIG. 3, top gap height 303 may vary depending upon the thickness of dice 103, 105, and 107 and the height of the electrical connections used, such as but not limited to solder bumps 111. The top mold flow 121 may have a height equal to top gap height 303 and may have a flow speed governed by the equation:

$$v = \frac{\Delta p d^2}{32 \, \mu l}$$

where Δp is the pressure drop applied to move the molding compound, μ is the melt viscosity of the molding compound, l is the cavity length, and d is the gap the molding compound is flowing through. Because the standoff height 305 may be small compared to the top gap height 303, the bottom mold flow 123 may progress much slower than the top mold flow 121. In another embodiment of the invention, the top gap height 303 may be smaller than the standoff height 305 which may cause the bottom mold flow 123 to have a higher flow speed than the top flow front 121. However, if flow modifier 109 is applied to the package substrate 101 to a height at least equal to the standoff height 305, the top mold flow 121 and the bottom mold flow 123 may be kept substantially separate.

Heights of the flow modifier 109 may depend on the height of the solder bump 111. For example, the solder bumps 111 may have a height between about 25 microns and about 100 microns, and the minimum height of the flow modifier 109 may similarly be between about 25 microns and about 100 microns. Other heights of the flow modifier 109 may also be within the scope of an embodiment of the invention, e.g., the height of the flow modifier 109 may be between about 75 microns and about 400 microns. Other heights of the solder bumps 111 and flow modifier 109 are also possible.

Figure 4A:
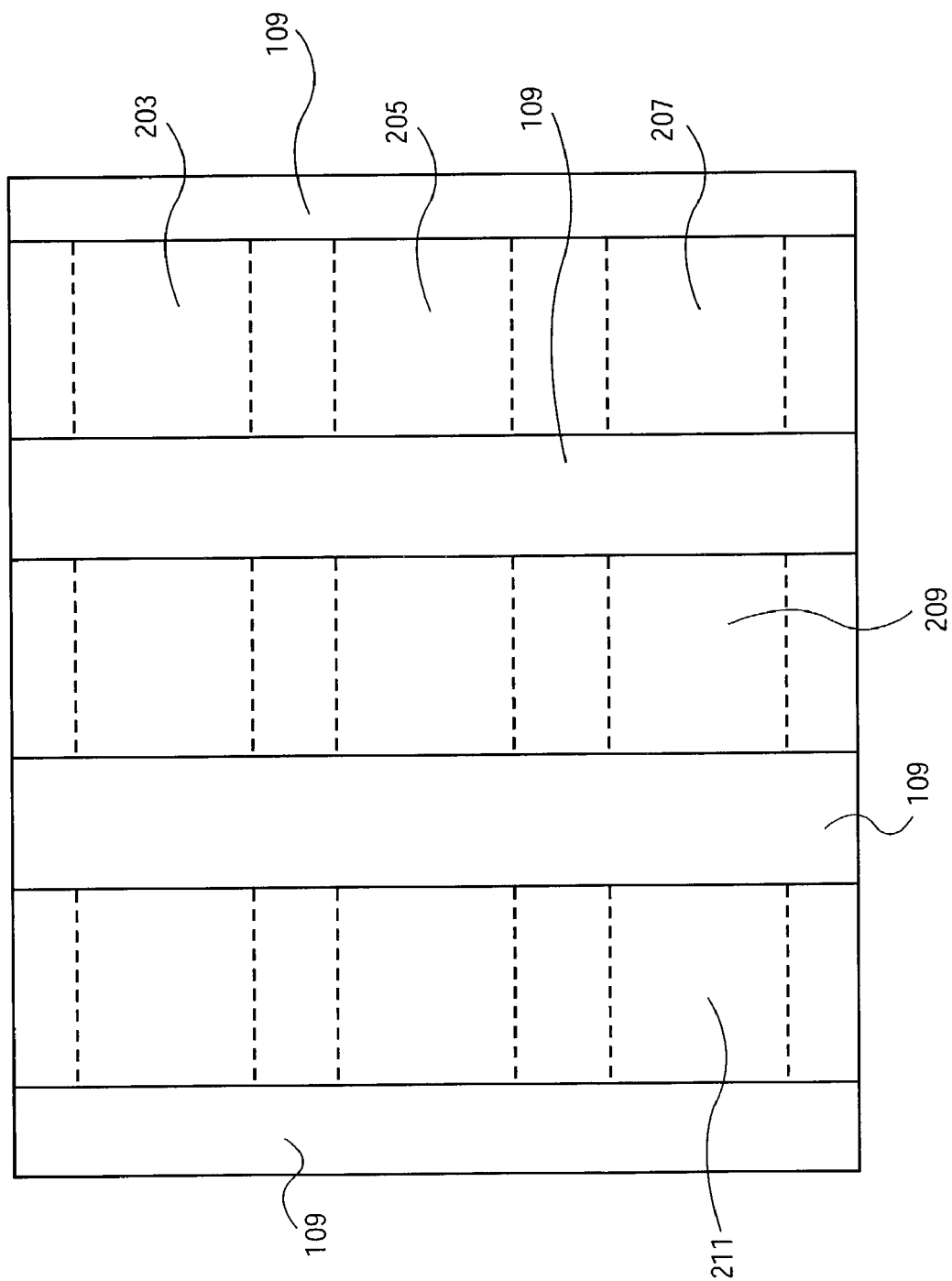
FIG. 4A shows a top view of an embodiment the invention after the flow modifier has been applied, but before the devices have been coupled to the package substrate.

Referring to FIG. 4A an embodiment of the invention is shown with flow modifier applied to the package substrate 101 before the coupling of the dice 103, 105, and 107 (seen in FIG. 1). After the device placement locations 203, 205, and 207 have been determined, the flow modifier 109 may be applied using various techniques, e.g., a screen printing process. The stencil used in the screen printing process may be designed using the device placement locations 203, 205, 207, 209, and 211. Other methods of applying the flow modifier 109 may also be within the scope of the invention.

Figure 4B:
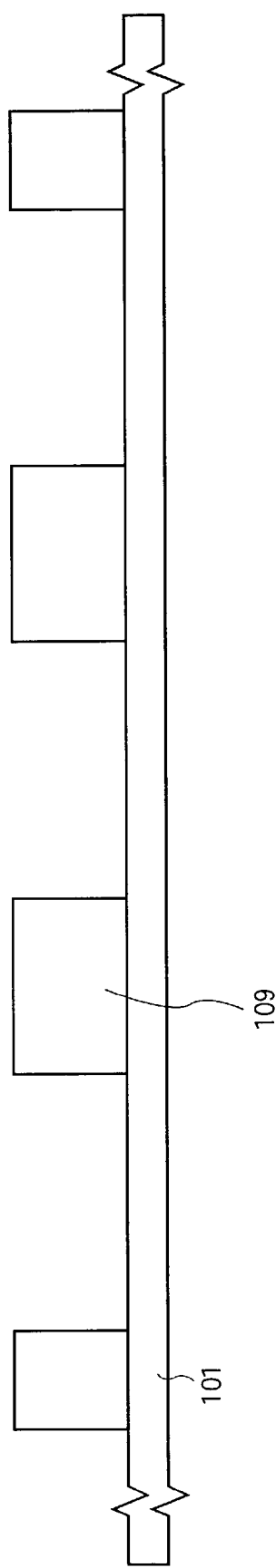
FIG. 4B shows a side view of the embodiment of FIG. 1 after the flow modifier has been applied, but before the dice have been coupled to the package substrate.

Referring to FIG. 4B, an embodiment of the invention is shown in the form of a side view of a package substrate 101 with flow modifier 109. The view in FIG. 4B is the same as the view in FIG. 1. The height of the flow modifier 109 may be predetermined based on a distance from the surface of a die, such as die 103 (seen in FIG. 1), used to couple the die 103 to the package substrate 101, to the surface of the package substrate 101 that is coupled to the die 103. The flow modifer 109 may then be applied to this predetermined height before the dice 103, 105, and 107 (seen in FIG. 1) are coupled to the underlying substrate 101.

Figure 5B:
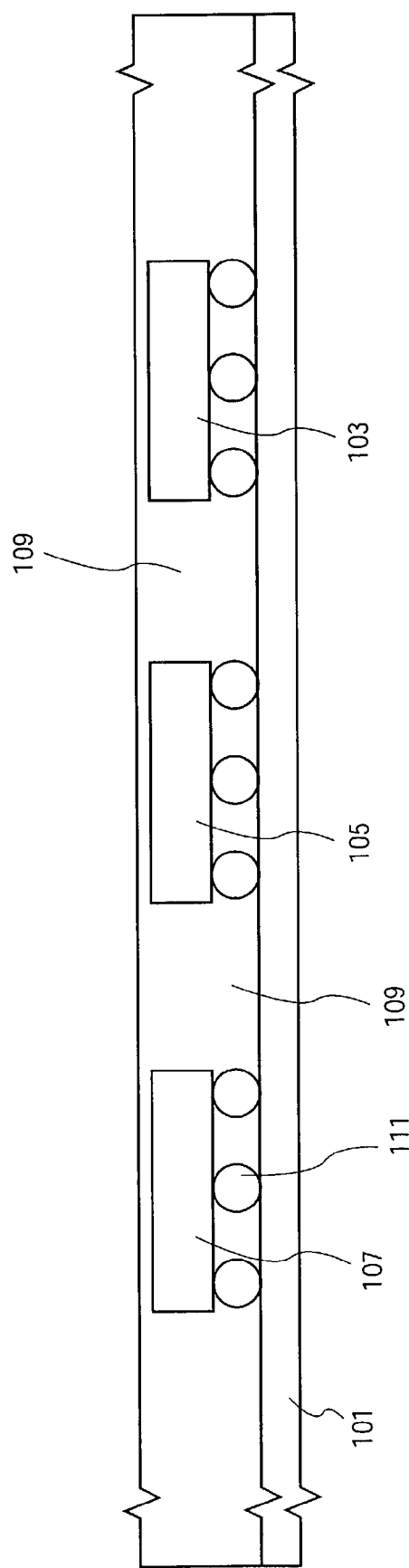
FIG. 5B shows a side view of an embodiment of the invention after the dice have been coupled to the package substrate.

Referring to FIG. 5A, a top view of an embodiment of the invention is shown after coupling the dice to the package substrate in the device placement locations. Referring to FIG. 5B, a side view of an embodiment of the invention is shown after coupling the dice to the package substrate in the device placement locations. The view in FIG. 5B is at right angles to the view in FIGS. 1 and 4B. In one embodiment of the invention, the dice 103, 105, and 107 are coupled to the package substrate 101 after the flow modifier 109 has been applied. In another embodiment of the invention, the flow modifier 109 may be applied after the dice 103, 105, and 107 have been coupled to the package substrate 101. The dice 103, 105, and 107 may be coupled to the package substrate 101 by a reflow process with solder to form solder bumps 111. Other methods of coupling the dice 103, 105, and 107 may also be within the scope of the invention. In one embodiment some dice (e.g. dice 521 and 523) may be coupled to the package substrate before the flow modifier 109, and other dice (e.g., dice 103, 105, 107) may be coupled to the package substrate after the flow modifier. Other sequences of coupling the dice 103, 105, 107, 521, and 523 may also be within the scope of the invention.

Figure 6:
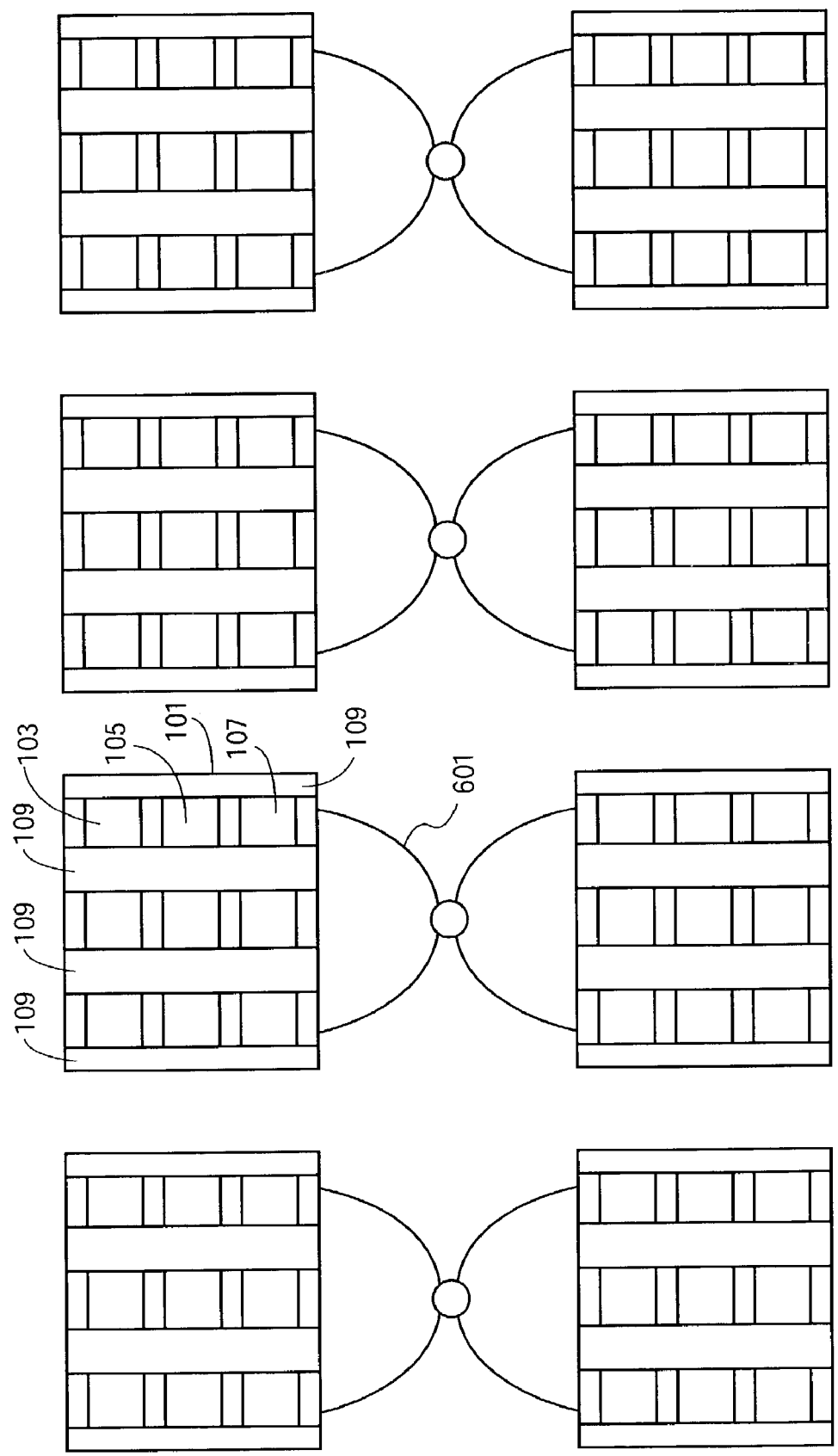
FIG. 6 shows a top view of an embodiment of the invention in a sequence of molding machines.

Referring to FIG. 6, a top view of an embodiment of the invention is shown with the package substrate and coupled dice placed into a molding machine. For purposes of illustration, the mold chases 120 (seen in FIG. 7) have been made transparent. After coupling the dice 103, 105, and 107 to the package substrate 101, and after the flow modifier 109 has been applied, the package substrate 101 and coupled dice 103, 105, and 107 may be placed into a molding machine with mold runners 601. Molding compound may be pushed through mold runners 601. Mold runners 601 may have various shapes, configurations, and thicknesses, as long as they are able to deliver the mold compound to the assembled package substrate and dice.

Figure 7:
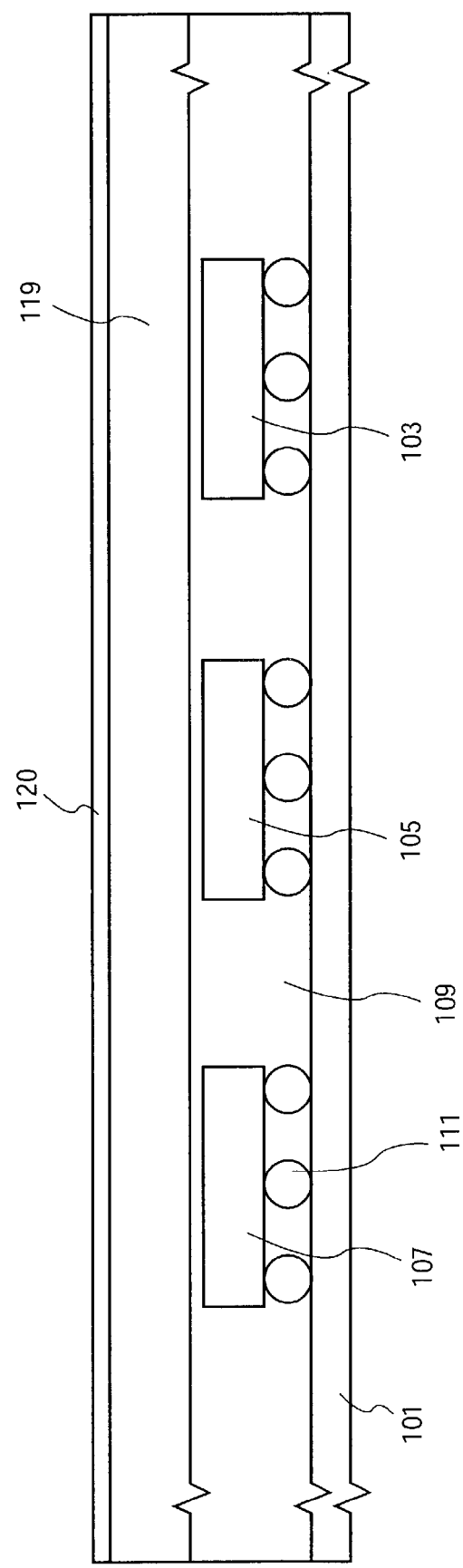
FIG. 7 shows a side view of an embodiment of the invention in a mold chase.

Referring to FIG. 7, a side view embodiment of the invention is shown with the package substrate 101, dice 103, 105, and 107, and flow modifier 109 placed in a molding machine. Top mold flow 121 (seen in FIG. 1) may flow between the top mold chase 120 in space 119 on top of dice 103, 105, and 107. The bottom mold flow 123 (seen in FIG. 1) may flow between the die 103, 105, 107 and the package substrate 101.

Figure 8:
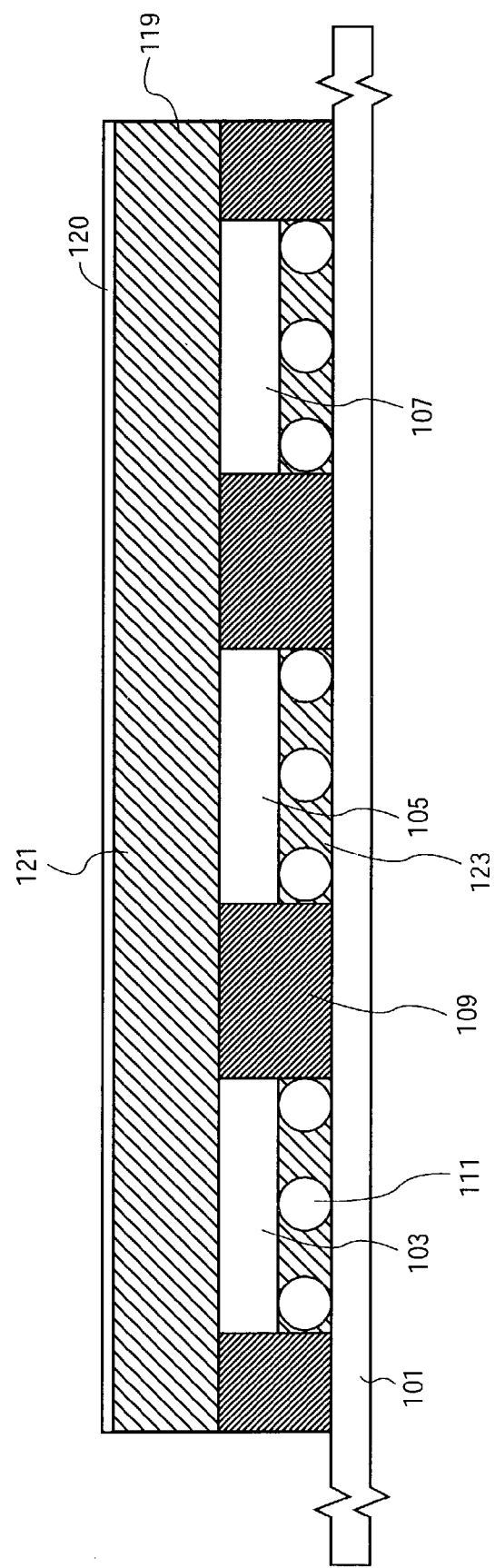
FIG. 8 shows a side view of an embodiment of the invention in a mold chase during the molding process.

Referring to FIG. 8, in some embodiments of the invention, the molding process occurs with a molding compound under pressure and at a high temperature. The molding compound may flow between package substrate 101 and mold chase 120 by flowing over, under, and around the dice 103, 105, and 107 in a laminar flow governed by the Hagen-Poissule equation:

$$\Delta p = \frac{32 \; \mu v l}{d^2}$$

Applying the equation to the dice 103, 105, and 107 and the package substrate 101, $\Delta p$ is the pressure drop applied to move the molding compound, $\mu$ is the melt viscosity of the molding compound, $v$ is the flow speed of the flow front, $l$ is the cavity length, and $d$ is the height of the gap the molding compound is flowing through.

As the molding compound is applied, part of the molding compound may flow over the dice 103, 105, and 107, such as top mold flow 121, while part of the molding compound flows under the dice 103, 105, and 107 in the gaps under the dice 103, 105, and 107 created by the solder bumps 111. Without flow modifier 109 the molding compound may flow around and over the dice 103, 105, and 107 and trap air under the dice 103, 105, and 107.

Keeping the top mold flow 121 separate from the bottom mold flow 123 may prevent the molding compound flow fronts from wrapping around a die's edge and trapping air bubbles under the dice. Substrates, such as but not limited to dice 103, 105, and 107, each with a top (first) and bottom (second) surface, may be coupled to an package substrate 101, also with a top (third) and bottom (fourth) surface, by electrical connections, such as but not limited to solder bump 111. Solder bump 111 may couple the top surface 110 of a first substrate, such as but not limited to an package substrate 101, to a bottom surface 112 of a second substrate, such as but not limited to die 103.

The bottom mold flow 123 may be separated from the top mold flow 121 by a material boundary such as but not limited to flow modifier 109. Other material boundaries may also be within the scope of an embodiment of the invention. The flow modifier 109 may prevent the top mold flow 121 from wrapping over the sides of or under dice 105 and 107. Because the top mold flow 121 may not flow into the bottom mold flow 123, the bottom mold flow 123 may push all the way through the gaps under the dice 103, 105, and 107 without trapping air under the dice 103, 105, and 107. The bottom mold flow 123 may then be between the first substrate, such as but not limited to the package substrate 101, and the second substrate, such as but not limited to die 103, at the same time as the top mold flow 121 is flowing over die 103 without trapping air under the die 103.

Figure 9:
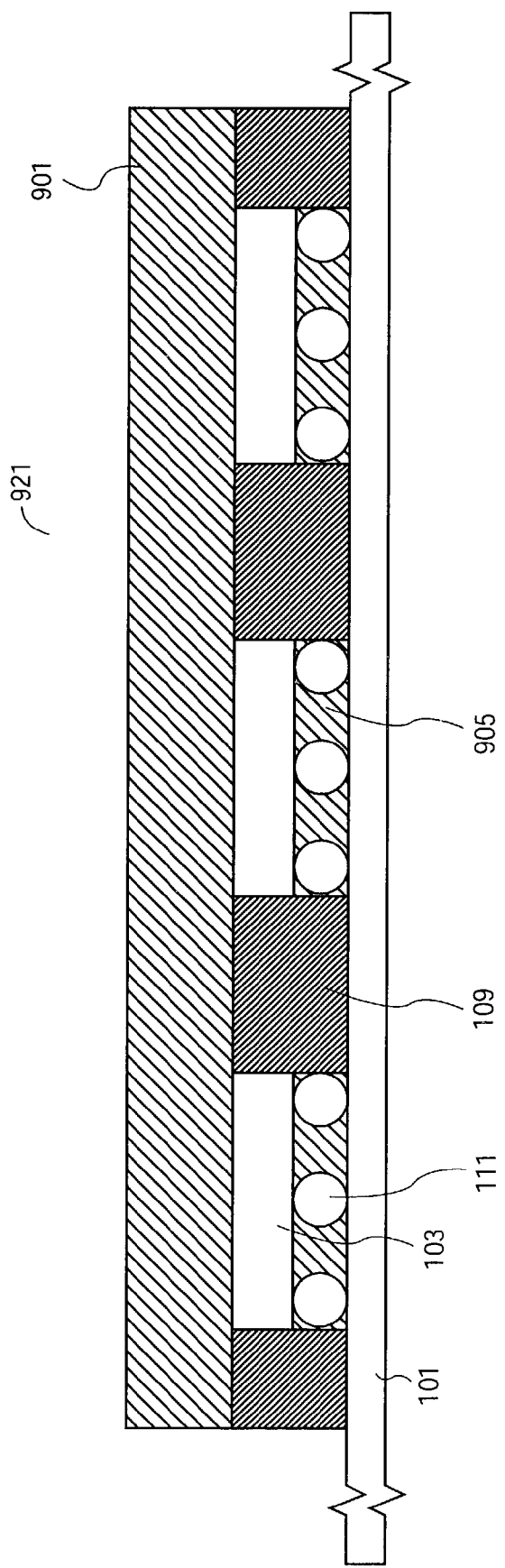
FIG. 9 shows a side view of a cross section of an embodiment of the invention after removal of the mold chase.

Referring to FIG. 9, a cross section of the embodiment of FIG. 8 is shown after the mold chase 120 has been removed, with cured top mold compound 901 and cured bottom mold compound 905. After the top mold and bottom mold compounds have been applied and have solidified, a molded matrix array package 921, comprising a package substrate 101, flow modifier 109, substrates 103, 105, and 107, top mold compound 901 and bottom mold compound 905, may be removed from the mold chase 120 as an integrated unit.

Figure 10:
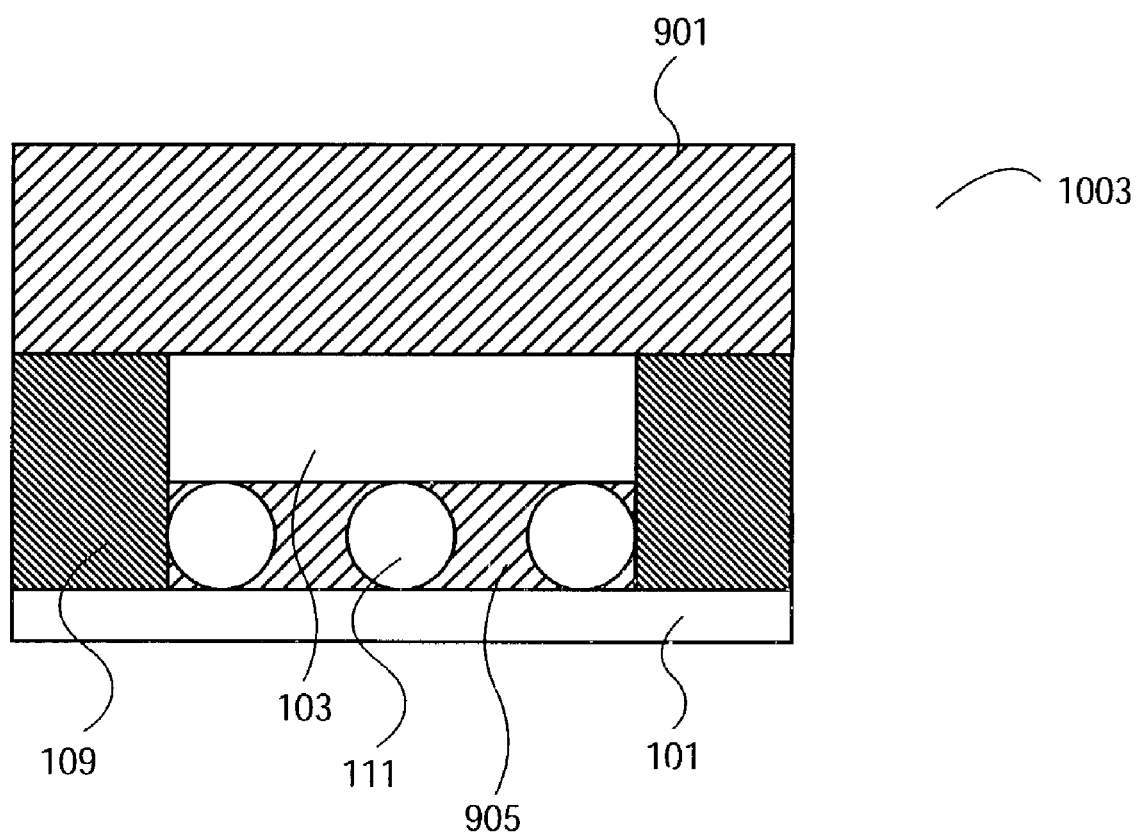
FIG. 10 shows an embodiment of the invention in the form of a singulated die package.

Referring to FIG. 10, an embodiment of the invention is shown after each die has been singulated. Die 103 may be singulated along its sides from the rest of the dice 105 and 107 (not shown).

The flow modifier 109 may remain with the singulated package 103 or may be removed. The die 103 may be singulated from the rest of the dice 105 and 107 using a singulating saw. Other singulating methods may also be used.

Figure 11:
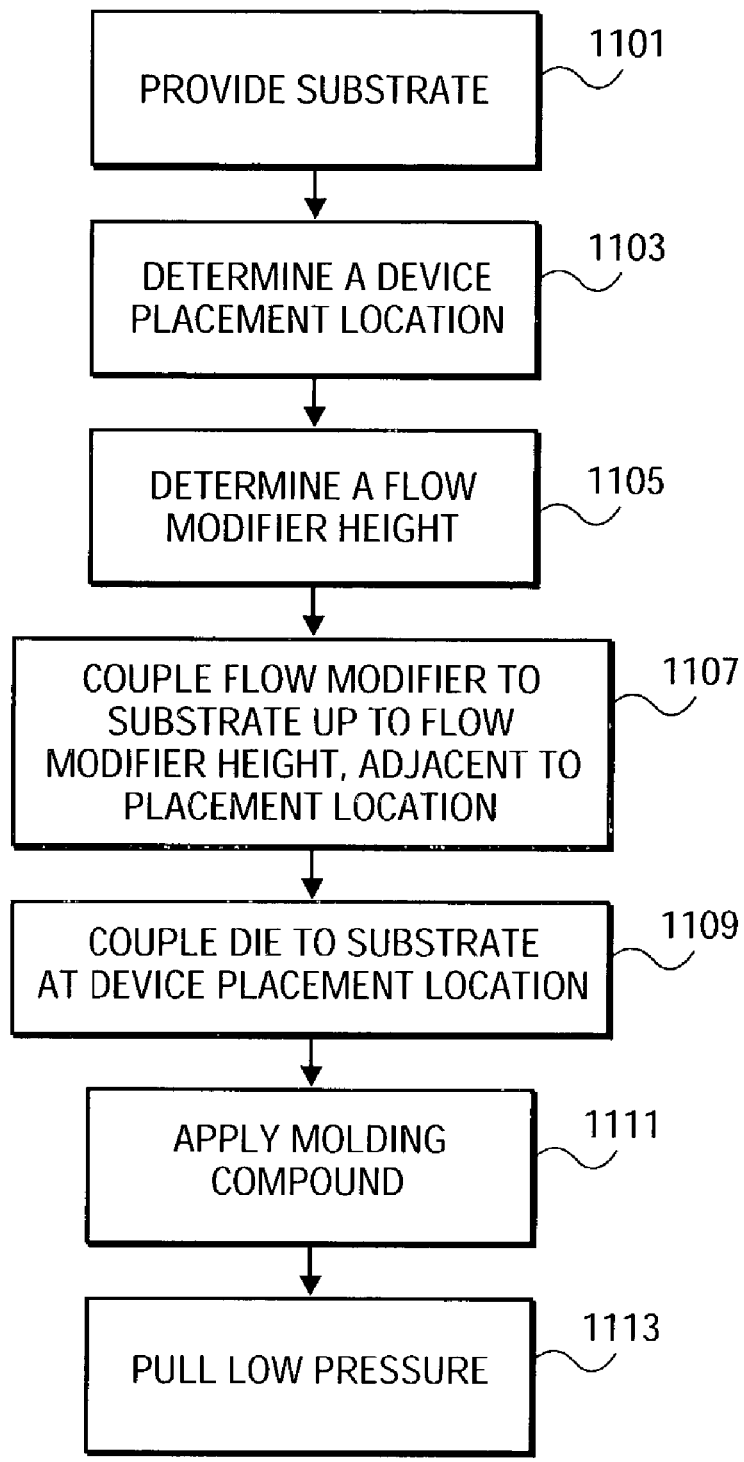
FIG. 11 shows an embodiment of the invention in the form of a flowchart for using flow modifiers.

Referring to FIG. 11, an embodiment of the invention is shown in the form of a flowchart for using flow modifiers. At block 1101 a substrate, such as but not limited to a package substrate, may be provided. At block 1103, a device placement location on the substrate may be determined for a die to be coupled to the substrate. At block 1105, a flow modifier height may be determined. In one embodiment the height is at least equal to a distance from a top surface of the substrate to a bottom surface of the die when the die is coupled to the substrate. At block 1107, a flow modifier may be coupled to the substrate adjacent to the device placement location, with the height of the flow modifier extending approximately to the height determined in block 1105. In one embodiment a single flow modifier may be coupled to the surface of the substrate adjacent to multiple device locations. At block 1109, a die may be coupled to the substrate at the device placement location. In various embodiments, the die may be coupled to the substrate before, after, or simultaneously with the flow modifier. At block 1111, a molding compound may be applied to the substrate/dice assembly. In one embodiment a single application of molding compound is diverted to two separate flows by the flow modifier, with one flow going over the die and the second flow going between the die and the substrate. In another embodiment two separate flows of molding compound are applied to the substrate/die assembly, one flow being directed above the die and the other flow being directed between the die and the substrate. In one embodiment, low pressure is applied at block 1113 to help the molding compound to move more easily.

Figure 12:
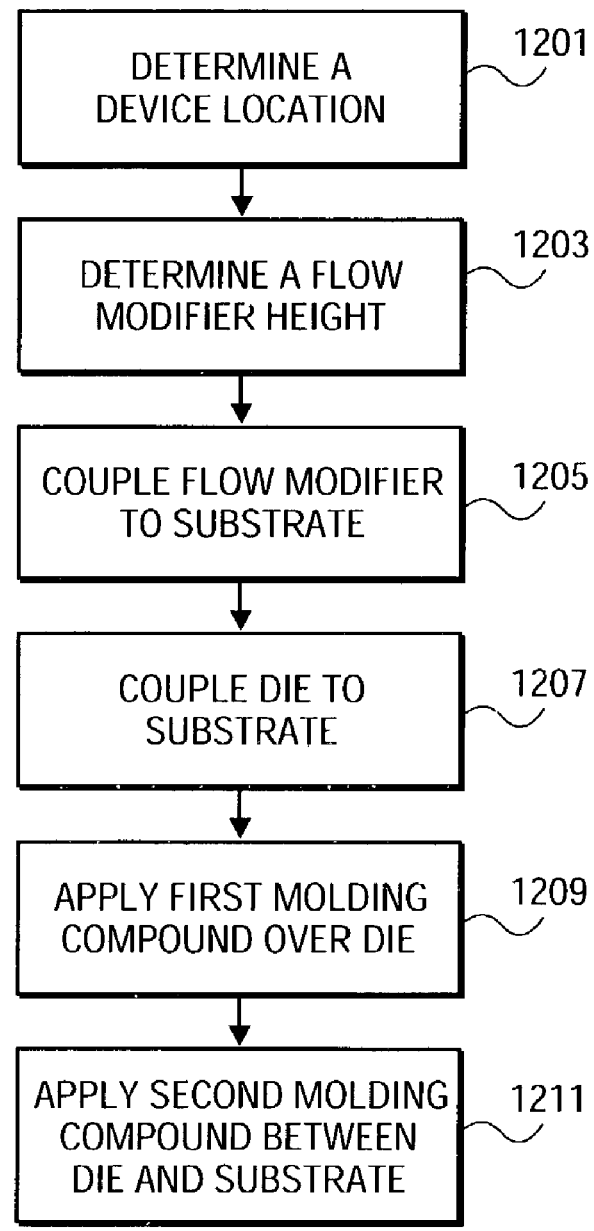
FIG. 12 shows an embodiment of the invention in the form of a flowchart of instructions provided by a machine-readable medium.

Referring to FIG. 12, an embodiment of the invention is shown in the form of a flowchart of instructions provided by a machine-readable medium to one or more processors that control one or more devices. A machine-readable medium includes any mechanism that provides (i.e., stores and/or transmits) information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.); etc. At block 1201, a device placement location may be determined for placement of a die on a substrate. At block 1203, a flow modifier height may be determined, with the height to be at least equal to a distance from a top surface of the substrate to a bottom surface of the die when the die is coupled to the substrate. At block 1205, a flow modifier may be coupled to the substrate adjacent to the device placement location, and extending to a height substantially equal to the flow modifier height determined in block 1203. At block 1207, a die may be coupled to the substrate at the device placement location determined in block 1201. In various embodiments, the die may be coupled to the substrate before, after, or at the same time as the flow modifier is coupled to the substrate. At block 1209, a first molding compound may be applied over the die. At block 1211, a second molding compound may be applied between the die and the substrate. The first molding compound may be applied before, after, or simultaneously with the second molding compound, and may be the same molding compound.

In one embodiment of the invention, flow modifiers may be used around a die coupled to a motherboard before the molding process. Another embodiment of the invention may be used in a direct chip process. Other embodiments of the invention may involve any molded package using a flow modifier to split a mold flow into two or more mold flows to prevent trapped air. In addition, other processes may be used in addition to applying flow modifiers to prevent trapped air. For example, in one embodiment of the invention, a low pressure may be pulled during the molding process over the dice to reduce trapped air during the molding process. In another embodiment of the invention, holes may be put through the package substrate below the dice 103, 105, and 107 (seen in FIG. 1) to allow air to escape as the molding compound flows over and under the package. In one embodiment of the invention, both low pressure and air holes may be used in conjunction with flow modifiers to reduce trapped air.

Although the previous figures depict flow modifier 109 being placed along the full length of two opposite sides of each die, other configurations may also be used. For example, flow modifier 109 may be placed along one side or three sides of a die. Also, flow modifier 109 may be placed along only a portion of any given side of the die. The horizontal gap between the flow modifier and the side of the die may have various dimensions. In one embodiment, this gap is effectively zero, to prevent air from escaping through the gap. In another embodiment, this horizontal gap may be sufficiently large for air to escape, but small enough to effectively prevent the flow of the more viscous molding material from passing therethrough. The preferred gap size may depend on various factors, such as the temperature of the molding material, the viscosity of the molding material at that temperature, the size of any solid filler materials in the molding material, etc.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

We claim:

1. An apparatus comprising:
a first substrate having a first surface and a second surface;
a second substrate, having a third surface and a fourth surface, coupled to said first substrate;
an electrical connection coupling said first surface of said first substrate to said third surface of said second substrate; and
a flow modifier on said first surface of said first substrate extending to at least a height even with said third surface of said second substrate, the flow modifier adapted to separate a first flow of molding compound adjacent to the third surface of the second substrate from a second flow of molding compound adjacent to the fourth surface of the second substrate.

2. The apparatus of claim 1 further comprising a molding compound between said first substrate and said second substrate.

3. The apparatus of claim 1 further comprising a molding compound on said fourth surface of said second substrate.

4. The apparatus of claim 1 wherein said second substrate is a flip chip.

5. The apparatus of claim 1 wherein said flow modifier is solder resist mask.

6. The apparatus of claim 1 wherein said electrical connection is a solder bump.

7. The apparatus of claim 6 wherein said solder bump comprises lead and tin.

8. The apparatus of claim 6 wherein a height of said solder bump is approximately in a range of 25 microns to 100 microns.

9. The apparatus of claim 1 wherein said flow modifier extends to a height approximately in a range of 75 microns to 400 microns.

10. The apparatus of claim 1 further comprising a third substrate coupled to said first substrate.

11. The apparatus of claim 10 wherein said flow modifier on said first substrate extends between said second substrate and said third substrate.

12. A system comprising:
a molded matrix array package;
a first substrate coupled to said molded matrix array package;
a second substrate coupled to said first substrate; and
a flow modifier coupled to said first substrate extending to a height at least equal to a distance from a bottom surface of said second substrate used to couple said second substrate to said first substrate, to a top surface of said first substrate that is coupled to said second substrate, wherein the flow modifier is shaped to substantially prevent intermingling of a bottom flow of mold compound adjacent the bottom surface of the second substrate with a top flow of mold compound adjacent a top surface of the second substrate.

13. The system of claim 12 further comprising a molding compound between said first substrate and said bottom surface of said second substrate.

14. The system of claim 12 further comprising a molding compound on said top surface of said second substrate.

15. The system of claim 12 wherein said second substrate is a flip chip.

16. The system of claim 12 wherein said height of said flow modifier is approximately between 75 microns and 400 microns.

17. The system of claim 12 further comprising a third substrate coupled to said first substrate.

18. The system of claim 17 wherein said flow modifier coupled to said first substrate covers a surface of said first substrate between said second substrate and said third substrate.

19. The apparatus of claim 2, further comprising molding compound on said fourth surface of said second substrate.

20. The apparatus of claim 19, further comprising molding compound in direct contact with a surface of the flow modifier that is furthest from the first substrate.

21. The apparatus of claim 1, wherein the flow modifier extends to a height not greater than the fourth surface of the second substrate.

22. The apparatus of claim 10, wherein the third substrate has a fifth surface closer to the first surface of the first substrate and a sixth surface further from the first surface of the first substrate, and wherein the second substrate is not between the fifth surface of the third substrate and the first surface of the first substrate and the third substrate is not between the third surface of the second substrate and the first surface of the first substrate.

23. The apparatus of claim 1, wherein the flow modifier extends substantially all the way along a lateral boundary of the third surface of the second substrate.

24. The apparatus of claim 1, wherein the flow modifier is substantially electrically non-conductive.

25. The apparatus of claim 1, wherein the flow modifier is positioned so there is a gap between the flow modifier and the second substrate, and wherein the gap is small enough to prevent mold compound in fluid form from passing therethrough.

26. The apparatus of claim 1, wherein the flow modifier is positioned so there is substantially no gap between the flow modifier and the second substrate.

27. An apparatus comprising:
a first substrate having a first surface;
a second substrate, having a second surface closer to the first surface and a third surface further from the first surface, coupled to said first substrate;
an electrical connection coupling the first surface of the first substrate to the second surface of the second substrate; and
a flow modifier on the first surface of the first substrate extending to at least a height even with the second surface of the second substrate, and extending substantially all the way along a first side of the second surface of the second substrate, the flow modifier lacking apertures along the first side of the second surface of the second substrate through which mold compound may flow.

28. The apparatus of claim 27, wherein the flow modifier is positioned so there is a gap between the flow modifier and the second substrate, and wherein the gap is small enough to prevent mold compound in fluid form from passing therethrough.

29. The apparatus of claim 27, wherein the flow modifier is positioned so there is substantially no gap between the flow modifier and the second substrate.

30. The apparatus of claim 27 further comprising molding compound between the first substrate and the second substrate, and molding compound on the third surface of the second substrate, wherein the molding compound between the first substrate and the second substrate consists of substantially the same material as the molding compound on the third surface of the second substrate.

31. The apparatus of claim 27, wherein the flow modifier extends to a height at least about even with the third surface of the second substrate.

* * * * *